United States Patent [19]

Lur

[11] Patent Number: 5,428,240
[45] Date of Patent: Jun. 27, 1995

[54] SOURCE/DRAIN STRUCTURAL CONFIGURATION FOR MOSFET INTEGRATED CIRCUIT DEVICES

[75] Inventor: Water Lur, Taipei, Taiwan

[73] Assignee: United Microelectronics Corp., Hsinchu, Taiwan

[21] Appl. No.: 271,859

[22] Filed: Jul. 7, 1994

[51] Int. Cl.6 .................... H01L 29/68; H01L 21/265
[52] U.S. Cl. ..................................... 257/389; 257/408; 257/653; 257/654; 437/28; 437/42; 437/228; 437/235; 437/931
[58] Field of Search ............... 257/389, 408, 653, 654; 437/28, 42, 228, 235, 931

[56] References Cited
U.S. PATENT DOCUMENTS 5,234,852  8/1993  Liou .................................. 257/336
5,278,441  1/1994  Kang ................................ 257/336

*Primary Examiner*—Edward Wojciechowicz
*Attorney, Agent, or Firm*—Ladas & Parry

[57] ABSTRACT

A source/drain structural configuration suitable for metal-oxide semiconductor field-effect transistors is provided, having a wedge-shaped configuration with a thickness that increases in the direction from its end near to one the channel of the transistor toward the other end. The source/drain configuration includes a shallow junction advantageously formed to reduce sheet resistance and prevent the hot carrier punch-through effect. The wedge-shaped source/drain configuration is fabricated by depositing a dielectric layer, which is flowable under thermal treatment, after the formation of a polysilicon gate electrode. After annealing, the dielectric layer is etched to form a wedge-shaped mask. The resulting mask has a thickness that decreases in the direction from its one end near the gate electrode toward the other end. The presence of the wedge-shaped shielding masks facilitates the formation of a pair of wedge-shaped source/drain regions on the substrate via implementation of an ion implantation procedure. The wedge-shaped mask also assists in achieving improved step coverage for the deposition of the pre-metal dielectric layer.

11 Claims, 7 Drawing Sheets

SOURCE/DRAIN STRUCTURAL CONFIGURATION FOR MOSFET INTEGRATED CIRCUIT DEVICES

BACKGROUND OF THE INVENTION

1. Field of the Invention

The present invention relates in general to metal-oxide semiconductor field-effect transistors (MOSFETs). In particular, the present invention relates to metal-oxide semiconductor field-effect transistors having an improved source/drain structural configuration and a method of fabricating the same.

2. Technical Background

Metal-oxide semiconductor field-effect transistors, here, after referred to as MOSFETs, are a major constituent of integrated circuits (IC) because they can be miniaturized in dimension to a greater extent than can many other devices. A natural consequence of the trend toward improved fabrication resolutions for integrated circuit devices is that such devices continue to shrink in size, down to the sub-micron level at present. The dimensions of MOSFETs found on IC substrates are shrinking and not only are they shrinking in planar directions, but the dimensions in the direction perpendicular to the surface of the IC device substrate are also being reduced simultaneously. If the depth of the MOSFET components is not reduced along with the reduction of their surface area dimensions, problems, such as electron punchthrough, may arise.

It is therefore desirable for integrated circuit MOSFETs to have not only a reduced planar dimension, but also a relatively shallow junction in the source/drain regions. Although a shallow junction reduces the disadvantage of short channel effect, the sheet resistance of the source/drain regions is increased as a result of the reduced cross-sectional area of the junctions. Unfortunately, if the doping concentration in the junctions is increased to reduce the resistance, then the hot electron effect resulting from the increased electric field generated by the heavily doped source/drain regions inevitably reduces the reliability of the MOSFETs.

In order to keep the resistance in the source/drain regions of the MOSFETs reasonably low while the dimensions of the IC device are reduced without increasing the electric field intensity in the source/drain regions, a transistor having a lightly-doped source/drain configuration has been proposed. FIG. 1A shows a cross-sectional view of the structural configuration of such a prior art transistor having a lightly-doped source/drain junction. In fabricating this prior art transistor, a field oxide layer 11, a gate oxide layer 12, and a polysilicon gate layer 13 are formed over a P-type substrate 10. An ion implantation process is employed to implant N-type impurities, such as phosphorus, into the P-type substrate 10 by using the polysilicon gate layer 13 as a mask to form lightly-doped $N^-$-conductivity type source/drain regions 14. Conventional deposition and etching procedures are then employed to form oxide spacers 15 on opposing side walls of the gate oxide layer 12 and the polysilicon gate layer 13. Finally, impurities, such as arsenic (As) or antinomy (Sb), are implanted into the P-conductivity type substrate 10 to form $N^+$-conductivity type source/drain regions 16 for the The structural configuration of this transistor prevents the hot electron effect because the source/drain regions 14 are tightly doped, which reduces the build-up of an electric field of excessive intensity near the drain, and because the source/drain regions 16 have a high doping concentration, which maintains a reasonable resistance value by itself. With the above transistor structural configuration, it should be noted, however, that the junction interface of the $N^+$-conductivity type source/drain region 16 and the P-conductivity type substrate 10 results in the generation of parasitic capacitance. The larger the junction interface area, the larger the parasitic capacitance, which reduces the speed of operation of this transistor device.

Moreover, an improvement in the conductivity of the source/drain regions 16 can be realized by employing the well-known technique of self-aligned silicide (salicide) to form a conducting layer on an appropriate place on the surface of the device.

The process for forming such salicide involves depositing metals such as Ti, Co, Ni, and Pt on the device surface. For example, when Ti metal is utilized, a Rapid Thermal Process (RTP) at a temperature of approximately 650° C. is performed for 20 to 60 seconds, and the portions with non-reacted metal are selectively removed by dipping the device surface in appropriate chemical solutions. In the case of Ti, portions containing silicon react with the metal, while portions containing silicon oxide do not. Then a solution of $NH_4OH/H_2O_2/H_2O$ is employed to etch away the unreacted Ti film and $Ti_5Si_3$, $TiN_xO_y$ etc. A second thermal process at a temperature of approximately 850°0 C. is performed for 20 to 60 seconds to allow the metal salicide 17 to achieve the crystalline phase of greatest stability and lowest resistivity, with a typical structural configuration as shown in FIG. 1B. Although such salicide fabricating process improves the conductivity of the source/drain regions, it also deepens the junction of the source/drain regions 16, which is undesirable because of the need for shallow junctions in the source/drain regions 16.

SUMMARY OF THE INVENTION

It is therefore an object of the present invention to provide a MOSFET with an improved source/drain structural configuration and a method for fabricating such a MOSFET. The structural configuration has a shallow junction and low sheet resistance for the source/drain regions to prevent the problems caused by short channel effect and hot carrier punchthrough, and to reduce the accompanying parasitic capacitance, to thereby improve the device's speed of operation.

The object of the present invention is achieved by providing, a source/drain structural configuration suitable for MOSFETs having a wedge-shaped configuration with a thickness that increases in the direction from its one end near the transistor's channel toward the other end. The shallow junction of such a source/drain configuration advantageously reduces sheet resistance and prevents the electron punchthrough effect. The wedge-shaped source/drain configuration is fabricated by depositing a thermal reflowable dielectric layer after the formation of a polysilicon gate electrode. Subsequent annealing and etching procedures result in the formation of a flat surface and a wedge-shaped mask. The mask has a thickness that decreases in the direction from its one end near to the gate electrode toward the other end. The presence of the wedge-shaped masks facilitates the formation of another pair of wedge-shaped source/drain regions via the implementation of an ion implantation procedure. The wedge-shaped mask also assists in achieving improved step coverage during the deposition of a pre-metal dielectric layer.

BRIEF DESCRIPTION OF THE DRAWINGS

Other objects, features and advantages of the present invention will become apparent by way of the presentation of the following detailed description of the preferred but non-limiting embodiments, with reference to the accompanied drawings, wherein.

DETAILED DESCRIPTION OF THE PREFERRED EMBODIMENTS

FIGS. 2A to 2F show cross sections of a MOSFET, during various fabrication stages, having improved source/drain regions in accordance with a preferred embodiment of the present invention. The fabrication process of the present invention is described via the following disclosure of preferred embodiments.

Figure 1A:
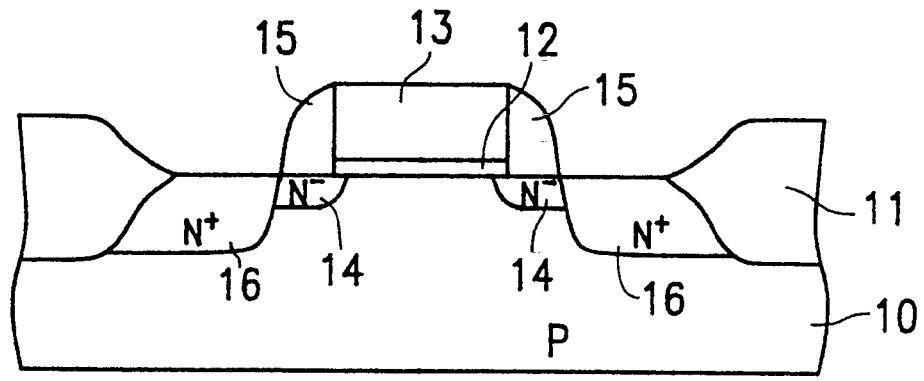
FIGS. 1A shows the cross-sectional view of a prior art MOSFET having lightly-doped source/drain regions.
Figure 1B:
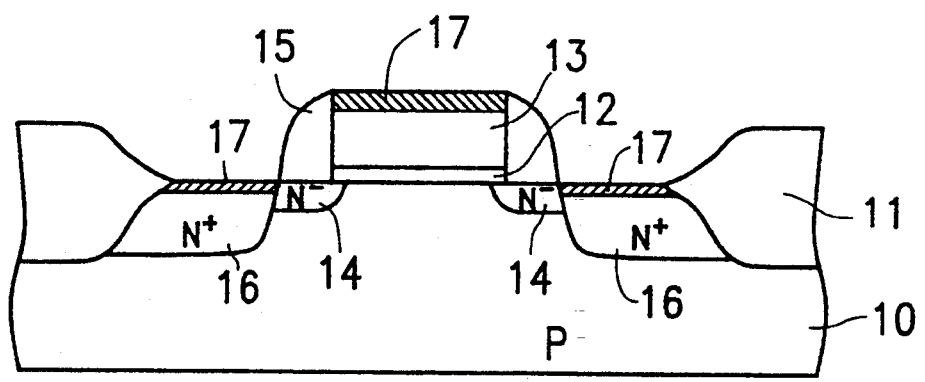
FIG. 1B shows the cross-sectional view of a prior art MOSFET having lightly-doped source/drain regions fabricated by the salicide technology.
Figure 2A:
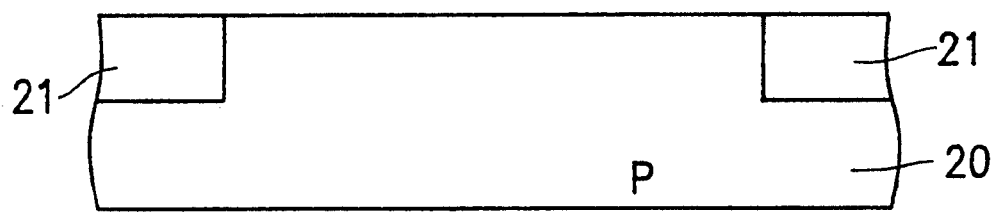
FIGS. 2A to 2F show, at selected stages of fabrication, the cross sections of a MOSFET having the improved source/drain regions in accordance with a preferred embodiment of the present invention.

As shown in FIG. 2A, a P-conductivity type silicon substrate 20 may be provided, which has field oxides 21 formed on it for defining an active area. An N-conductivity type substrate may be alternatively used, in which case the conductivity types of the source/drain regions be used correspondingly modified. If a P-conductivity type substrate is used, then the resulting device is as depicted in FIG. 2F. If, on the other hand, an N-conductivity type substrate is used, then the resulting device is as depicted in FIG. 2G. The method of forming the field oxides 21 may be by a conventional method of modified local oxidation of silicon (modified LOCOS), or by the method of trench isolation. Other isolation techniques are taught in U.S. patent applications bearing Ser. Nos. 08/215,175; 08/215,227; and 08/215,228 (all filed Mar. 21, 1994 and all assigned to the assignee of this application) and 08/241,183 (filed May 11, 1994 and assigned to the assignee of this application). The disclosures of the four aforementioned U.S. Patent Applications are hereby incorporated herein by this reference. The result of such processes is recessed field oxides 21 braving top surfaces flush with the surface of the silicon substrate 20.

Figure 2B:
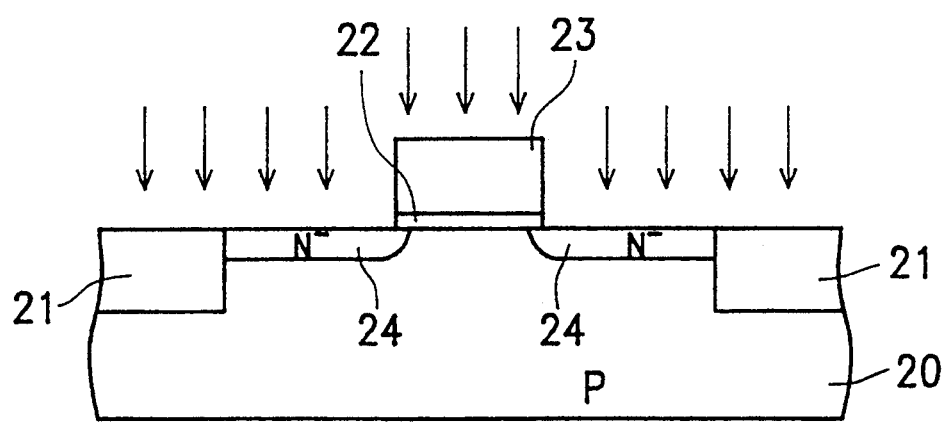

FIG. 2B illustrates that a gate oxide layer 22 and a polysilicon gate layer 23 are then subsequently formed onto the silicon substrate 20 and patterned to establish the gate electrode configuration depicted using conventional techniques. Utilizing the established gate electrode configuration as a mask, N-conductivity type impurities, such as, phosphorus, are often implanted into the P-conductivity type silicon substrate 20 utilizing an ion implantation process. As a result, $N^-$-conductivity type lightly-doped source/drain regions 24 are formed on either side of the gate electrode configuration 22, 23.

Figure 2C:
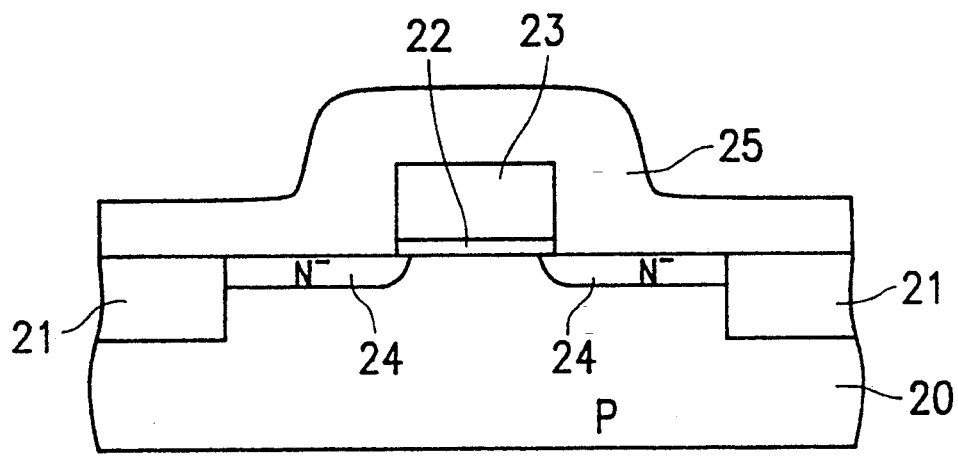
Figure 2D:
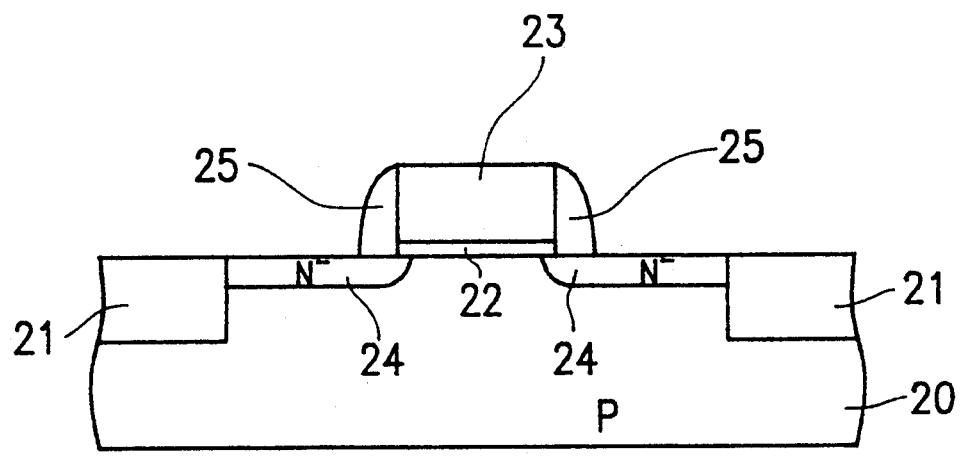

Referring now to FIG. 2C, and subsequently to FIG. 2D, an oxide layer 25 is next deposited on the; surface of the exposed areas of the P-conductivity type silicon substrate 20 and the gate electrode configuration. An anisotropic etching process, such as a reactive ion etching (RIE) process, is then employed to etch the oxide layer 25 vertically a depth equal to its nominal thickness on the substrate. Since the oxide layer 25 is thicker than usual adjacent the side walls of the gate electrode configuration 22, 23, spacers 25 (FIG. 2D) are formed from the layer of oxide 25 adjacent those side walls as a result of the RIE process.

Figure 2E:
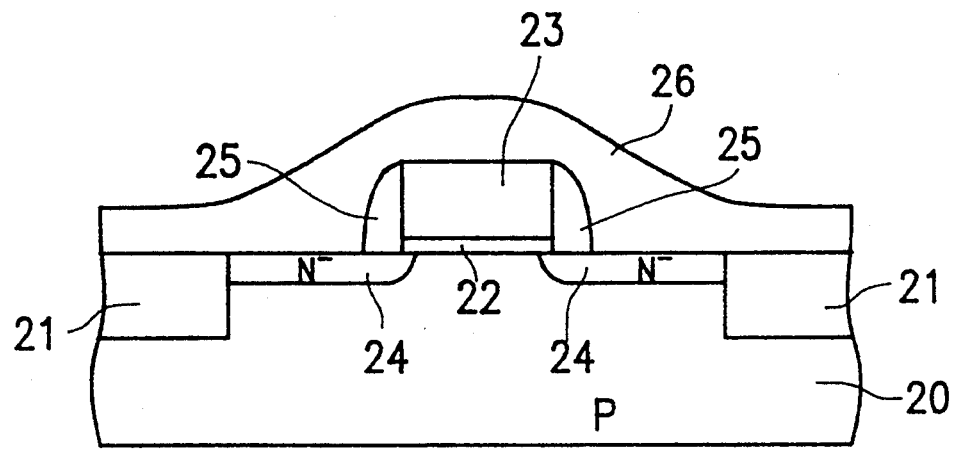
Figure 2F:
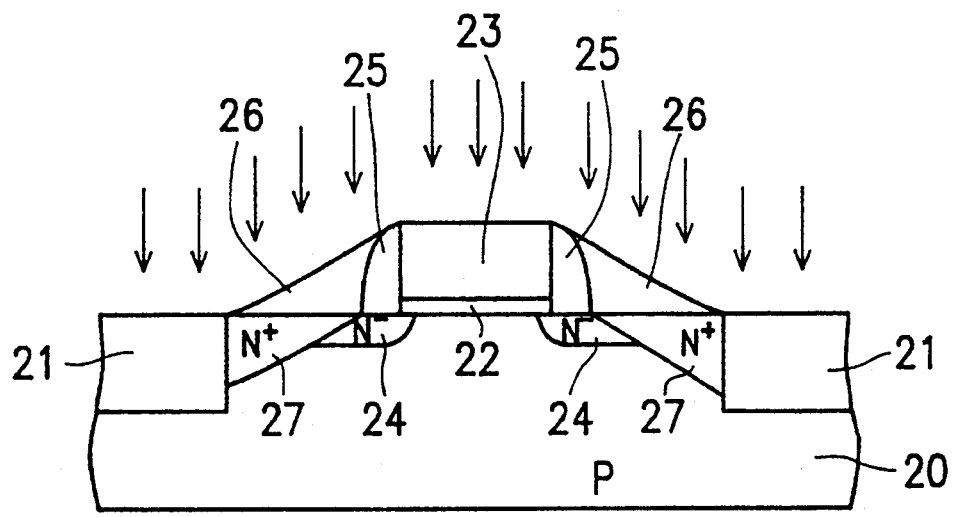
Figure 2G:
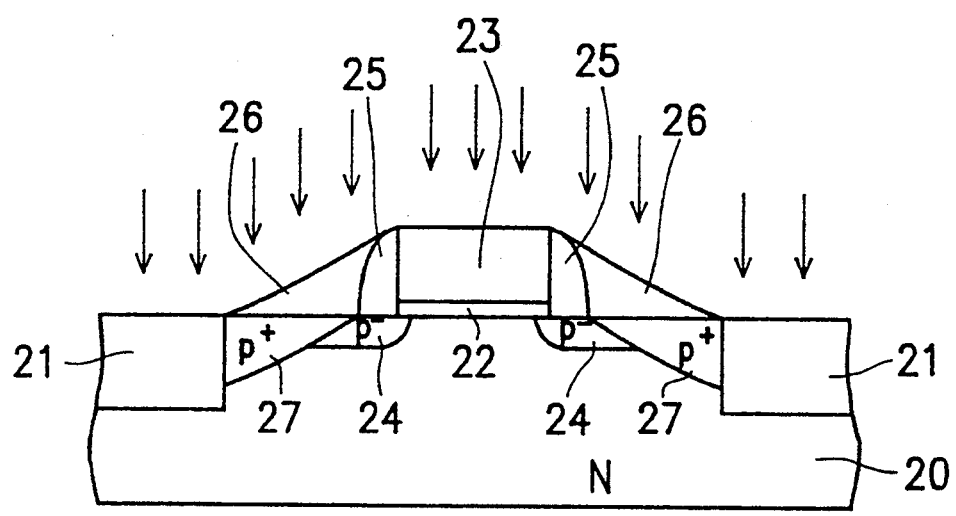
FIG. 2G depicts a device similar to that of FIG. 2F, but formed on an N type substrate rather than a P type substrate.

Now referring to FIGS. 2E, a layer of dielectric material, such as, borophosphosilicate glass (BPSG) layer 26, capable of reflow under thermal treatment, is deposited on the exposed area of the P-conductivity type silicon substrate 20, the polysilicon gate layer 23, and the oxide spacers 25. Since BPSG exhibits liquid properties at sufficiently elevated temperatures, an annealing procedure may be utilized to reflow the BPSG layer 26 to achieve better step coverage. Dielectric materials suitable for the layer 26 include borophosphosilicate glass (BPSG), borosilicate glass (BSG), or phosphosilicate glass (PSG). Spin-on glass (SOG) and polyimide may also be used.

After the formation of the BPSG (or suitable dielectric material) layer 26, a conventional dry or wet etching procedure is then performed to obtain a generally wedged-shaped BPSG layer 26 as is shown in FIGS. 2F and 2G. The wedged-shaped layer 26 has a thickness decreasing from the end near the spacers oxide layer 25 toward the other end near the recessed field oxides 21. Thereafter, the wedged-shaped layer 26, the oxide spacers 25, and the polysilicon gate layer 23 are utilized as a mask for an ion implantation process. N-type impurities such as, arsenic or antinomy, are implanted into the P-type silicon substrate 20, in order to form $N^+$-type source/drain regions 27. The wedge-shaped BPSG layer 26 has a partial masking effect so that a similarly wedged-shaped $N^+$-conductivity type source/drain regions 27 are formed. The wedge-shaped $N^+$-conductivity type source/drain regions 27 are shaped by this process so that they have a thickness which increases, starting at a near end near the $N^-$-conductivity type lightly-doped source/drain region 24, towards a remote end adjacent the recessed field oxides 21.

The generally wedge-shaped source/drain configuration provides the shallow junction desired in the source/drain regions, and is therefore suitable for use in the fabrication of smaller semiconductor components. The disclosed configuration also avoids the aforementioned short channel drawback effect. The thicker end of the wedge of the configuration also provides sufficient conductance (i.e., reduced sheet resistance) without the electron punchthrough effect problem previously mentioned. Moreover, the reduced junction area with the substrate 20 also results in reduced parasitic capacitance that directly leads to improved device operation speed. Additionally, the generally wedge-shaped BPSG layer 26 contributes to improved step coverage for the dielectric layer that will typically be deposited before a subsequent metal layer is formed.

Figure 3A:
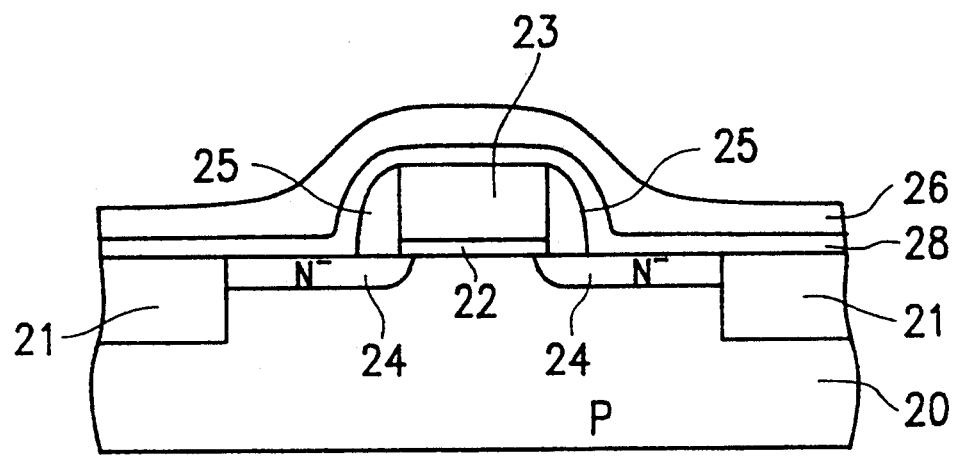
FIGS. 3A and 3B show, at two selected stages of fabrication, the cross sections of a MOSFET having the improved source/drain regions in accordance with another preferred embodiment of the present invention.
Figure 3B:
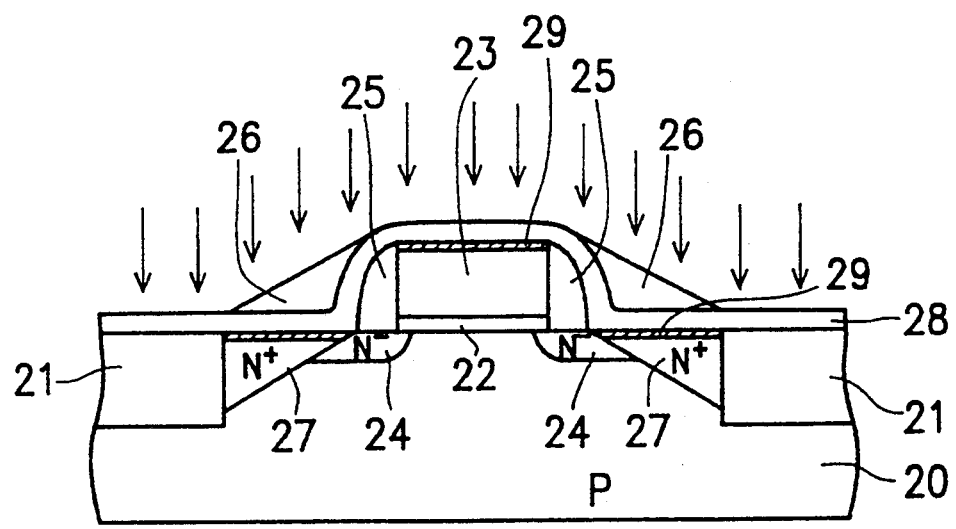
Figure 3C:
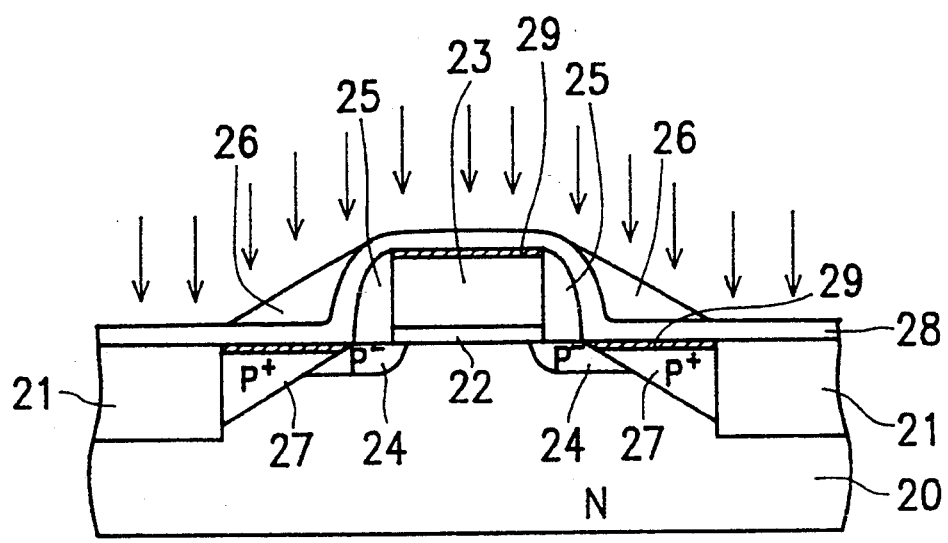
FIG. 3C depicts a device similar to that of FIG. 3B, but formed on an N type substrate rather than a P type substrate.

An alternative preferred embodiment of the invention is shown in FIGS. 3A and 3B. Again, the embodiment of FIGS. 3A and 3B assume that an P-conductivity type substrate is utilized. An N-conductivity type substrate be alternatively be used, in which case the resulting device appears as is depicted in FIG. 3C (i.e. with appropriate changes in the conductivity type of the source/drain regions). In FIG. 3A, the processing accuracy of the wet or dry etching procedure, which was previously described with reference to FIG. 2F, that forms the wedge-shaped BPSG layer 26 may be improved by forming a thin layer 28, preferably having a thickness in a range of 100 Å to 300 Å and preferably of silicon nitride, before layer 26 is deposited. Layer 28 is utilized as an etch-stopping layer which stops the etch of the BPSG layer 26. As such, a generally wedge-shaped N+-type source/drain region 27 may be obtained pursuant to a fabrication procedure such as the one previously described with reference to FIGS. 2F and 2G, i.e., by controlling the etch so that layer 26 is only partially etched, leaving behind the generally wedge-shaped elements 26 shown in FIGS. 3B and 3C, and then implanting suitable impurities using elements 26 as a mask. The etch rates of layer 26 and layer 28 are different, so that layer 28 is effective as an etch-stopping layer.

The etch-stopping layer 28 of the embodiment of the present invention as shown in FIGS. 3A, 3B and 3C is preferably a silicon nitride ($Si_3N_4$), boron nitride (BN), or undoped silicon dioxide ($SiO_2$) layer. More generally, the etch-stoping layer 28 is a dielectric layer with a greater etching resistance than that of the BPSG layer 26.

Although the foregoing detailed description of the present invention have exemplified N-channel MOSFETs for the inventive source/drain structural configuration, it may be readily appreciated that, with appropriate modifications to the fabrication steps, that P-channel MOSFETs having the disclosed source/drain structural configuration may be fabricated on a N-conductivity type substrate, as previously explained. The present invention is also applicable to the salicide configuration as shown in FIGS. 3B and 3C, although thinner than usual metal silicide 29 is preferably used. The salicide is utilized to reduce the resistivity of the contacts to the source/drain regions.

Those skilled in the art will now appreciate that the structural configuration of the present invention is also applicable to constructions other than the lightly-doped source/drain regions. That is the present invention provides a generally wedge-shaped mask structure and when that mask structure is used as a mask to an ion implantation procedure, the resulting implanted region is similarly wedge shaped. Those skilled in the art may well utilize such structures outside of the lightly-doped source/drain region applications disclosed herein.

Having described the invention in correction with certain embodiments thereof, modification may now suggest itself to those skilled in the art. Thus the invention is not to be limited to the disclosed embodiments, except as specifically required by the appended claims.

I claim:

1. A metal-oxide semiconductor field-effect transistor formed on a silicon substrate, comprising:

a gate electrode configuration formed on the silicon substrate, said gate electrode configuration including: a gate oxide layer and a polysilicon gate layer, with an area of the silicon substrate underlying said gate electrode configuration providing a channel;

a pair of lightly-doped source/drain regions formed on opposing ends of said channel in the silicon substrate;

a pair of spacers formed on opposing side walls of said gate electrode configuration;

a pair of wedge-shaped masks formed on the silicon substrate and contacting said pair of spacers formed on opposing side walls of said gate electrode configuration, said pair of wedge-shaped masks having a thickness that decreases in a direction from one end of said mask substantially adjacent to the pair of spacers formed on opposing side wails of said gate electrode configuration toward another end of said mask; and a pair of source/drain regions formed in the silicon substrate in regions outside of said lightly-doped source/drain regions and corresponding to said pair of wedge-shape masks, each of said pair of source/drain regions having a thickness that increases in a direction from one end of said region substantially adjacent to said pair of lightly-doped source/drain regions toward another end of said region, complementary to said thickness of said wedge-shaped mask.

2. The metal-oxide semiconductor field-effect transistor of claim 1, wherein the silicon substrate is a P-conductivity type silicon substrate, said pair of lightly-doped source/drain regions are $N^-$-conductivity type regions, and said pair of source/drain regions are $N^+$-conductivity type regions.

3. The metal-oxide semiconductor field-effect transistor of claim 1, wherein the silicon substrate is a N-conductivity type silicon substrate, said pair of lightly-doped source/drain regions are $P^-$-conductivity type regions, and said pair of source/drain regions are $P^+$-conductivity type regions.

4. The metal-oxide semiconductor field-effect transistor of claims 1, wherein said pair of wedge-shaped masks are selected from the group consisting of borophosphosilicate glass, borosilicate glass, phosphosilicate glass, spin-on glass, and polyimide.

5. A process for fabricating a metal-oxide a semiconductor field-effect transistor on a silicon substrate, comprising the steps of:

(a) forming a gate on the silicon substrate;

(b) implanting impurities into the silicon substrate, utilizing said gate as a mask, to form a pair of source/drain regions;

(c) forming a pair of oxide spacers on opposing side walls of said gate electrode configuration;

(d) depositing a dielectric layer on the silicon substrate, said oxide spacers, and said gate electrode configuration;

(e) etching said dielectric layer to form a pair of wedge-shaped masks adjacent to said pair of oxide spacers, said wedge-shaped masks having a thickness that decreases in a direction away from said pair of oxide spacers; and (f) implanting impurities into the silicon substrate through said wedge-shaped masks.

6. The process for fabricating a metal-oxide semiconductor field-effect transistor of claim 5, wherein the silicon substrate is a P-conductivity type silicon substrate, said pair of source/drain regions are lightly-doped $N^-$-conductivity type regions, and said pair of source/drain regions are $N^+$-conductivity type regions.

7. The process for fabricating a metal-oxide semiconductor field-effect transistor of claim 5, wherein the silicon substrate is a N-conductivity type silicon substrate, said pair of lightly-doped source/drain regions are $P^-$-conductivity type regions, and said pair of source/drain regions are $P^+$-conductivity type regions.

8. The process for fabricating a metal-oxide semiconductor field-effect transistor of claims 5, wherein said pair of wedge-shaped masks are selected from the group consisting of borophosphosilicate glass, borosilicate glass, phosphosilicate glass, spin-on glass, and polyimide.

9. The process for fabricating a metal-oxide semiconductor field-effect transistor of claim 5, further comprising a step of depositing an etch-stopping layer having a thickness in a range of 100 Å to 300 Å prior to said step (d) of depositing said dielectric layer.

10. The process for fabricating a metal-oxide semiconductor field-effect transistor of claim 9, wherein said etch-stopping layer are selected from the group consisting of silicon nitride, boron nitride, and silicon dioxide.

11. The process for fabricating a metal-oxide semiconductor field-effect transistor of claim 5, further comprising a step of forming a metal salicide layer on said gate electrode configuration and said source/drain regions.

* * * * *